United States Patent [19]

Sergio

[11] Patent Number: 4,554,062
[45] Date of Patent: Nov. 19, 1985

[54] MACHINE FOR THE CONTINUOUS GOLD-PLATING OF CONTACT TABS

[75] Inventor: Sala Sergio, Trezzo Sull'Adda, Italy
[73] Assignee: Telmec SPA, Milan, Italy
[21] Appl. No.: 623,427
[22] Filed: Jun. 22, 1984
[30] Foreign Application Priority Data Jun. 23, 1983 [IT] Italy ................................ 21764 A/83
Feb. 29, 1984 [IT] Italy ............................. 21052/84[U]

[51] Int. Cl.$^4$ ..................... C25D 17/02; C25D 17/10; C25D 17/28
[52] U.S. Cl. ................................. 204/206; 204/224 R
[58] Field of Search .................... 204/224 R, 206, 279

[56] References Cited

U.S. PATENT DOCUMENTS

| | | | |
|---|---|---|---|
| 3,723,283 | 3/1973 | Johnson et al. | 204/206 |
| 4,155,815 | 5/1979 | Francis et al. | 204/224 R X |
| 4,186,062 | 1/1980 | Eidschun | 204/224 R X |
| 4,402,799 | 9/1983 | Ash et al. | 204/224 R X |
| 4,425,212 | 1/1984 | Francis | 204/224 R X |

Primary Examiner—Donald R. Valentine
Attorney, Agent, or Firm—Karl F. Ross; Herbert Dubno

[57] ABSTRACT

The present invention relates to a machine for the continuous gold-plating of contact tabs for printed circuit boards which comprises a plurality of cells aligned in sequence which perform the operations of stripping, nickel-plating and gold-plating, and also intermediate operations of rinsing and neutralization, and through which cells said printed circuit boards are conveyed by a double conveyor belt which also effects the cathodic electrical contact for each cells. The said cells are provided with one or more feed chambers and at least one collection tank, provision being made for a chemical or electrochemical bath cascade flow area between said feed chamber or chambers and said collection tank or tanks. Losses from the chemical or electrochemical baths are prevented by recovery chambers placed at the inlet and outlet of each cell.

12 Claims, 9 Drawing Figures

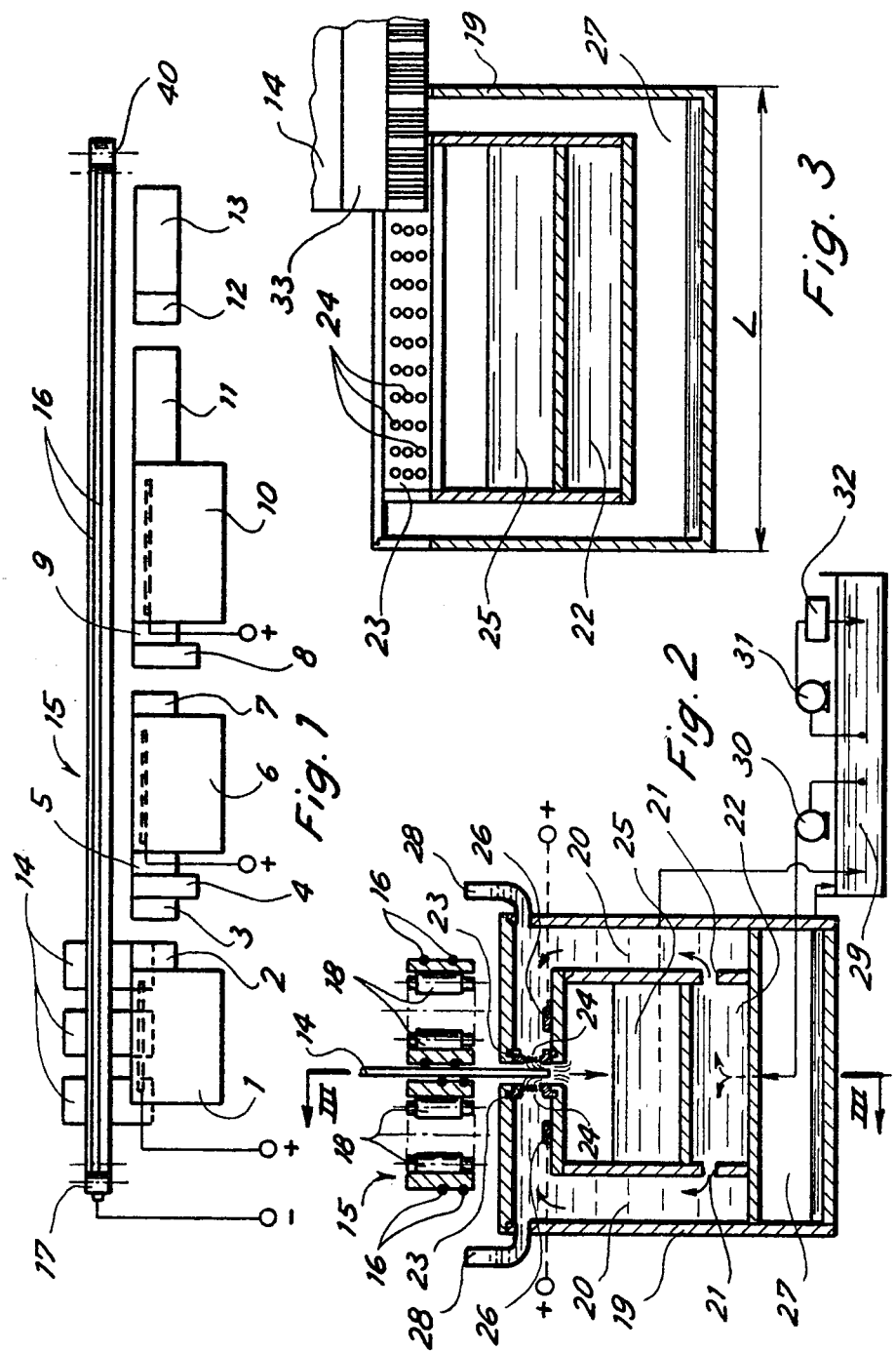

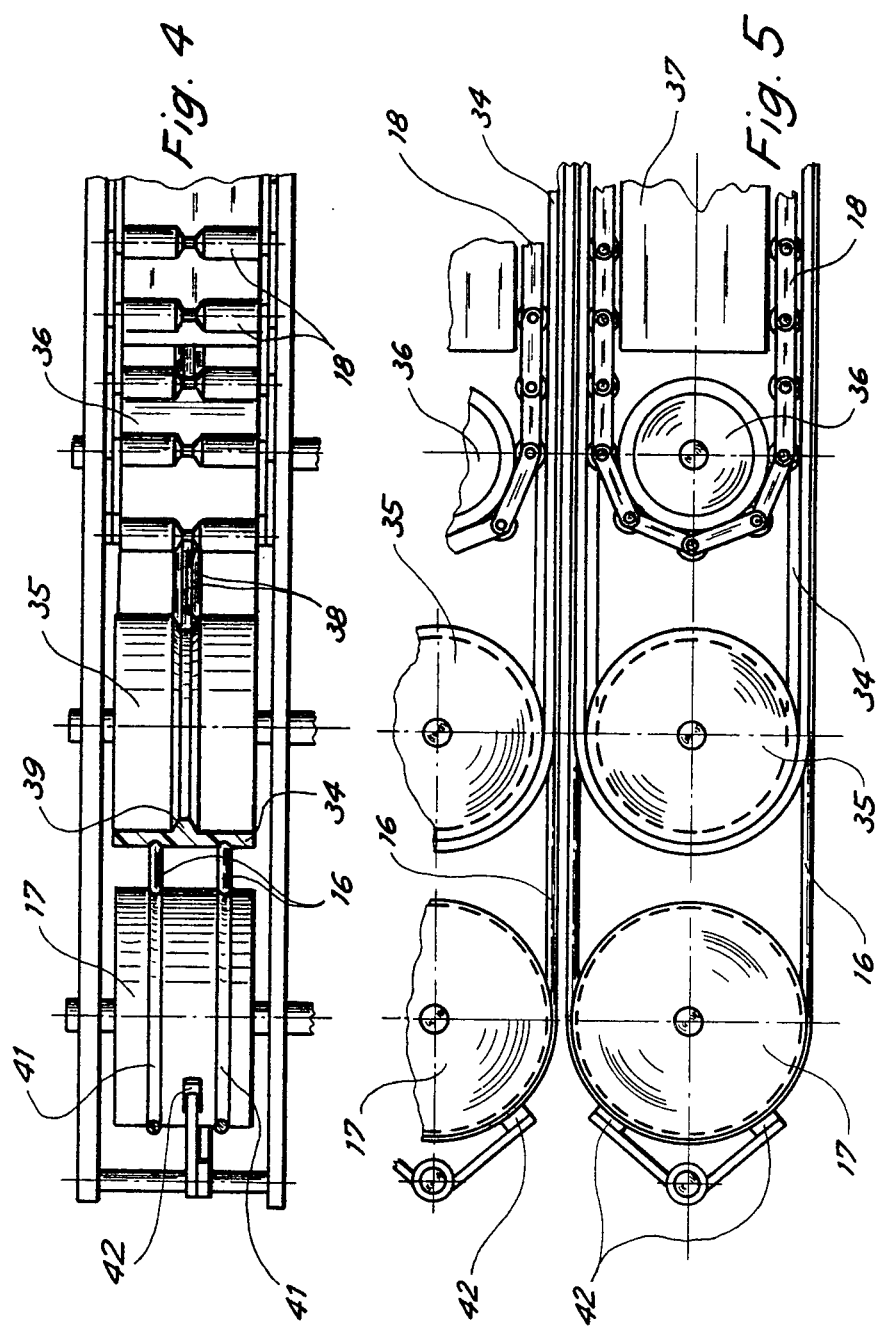

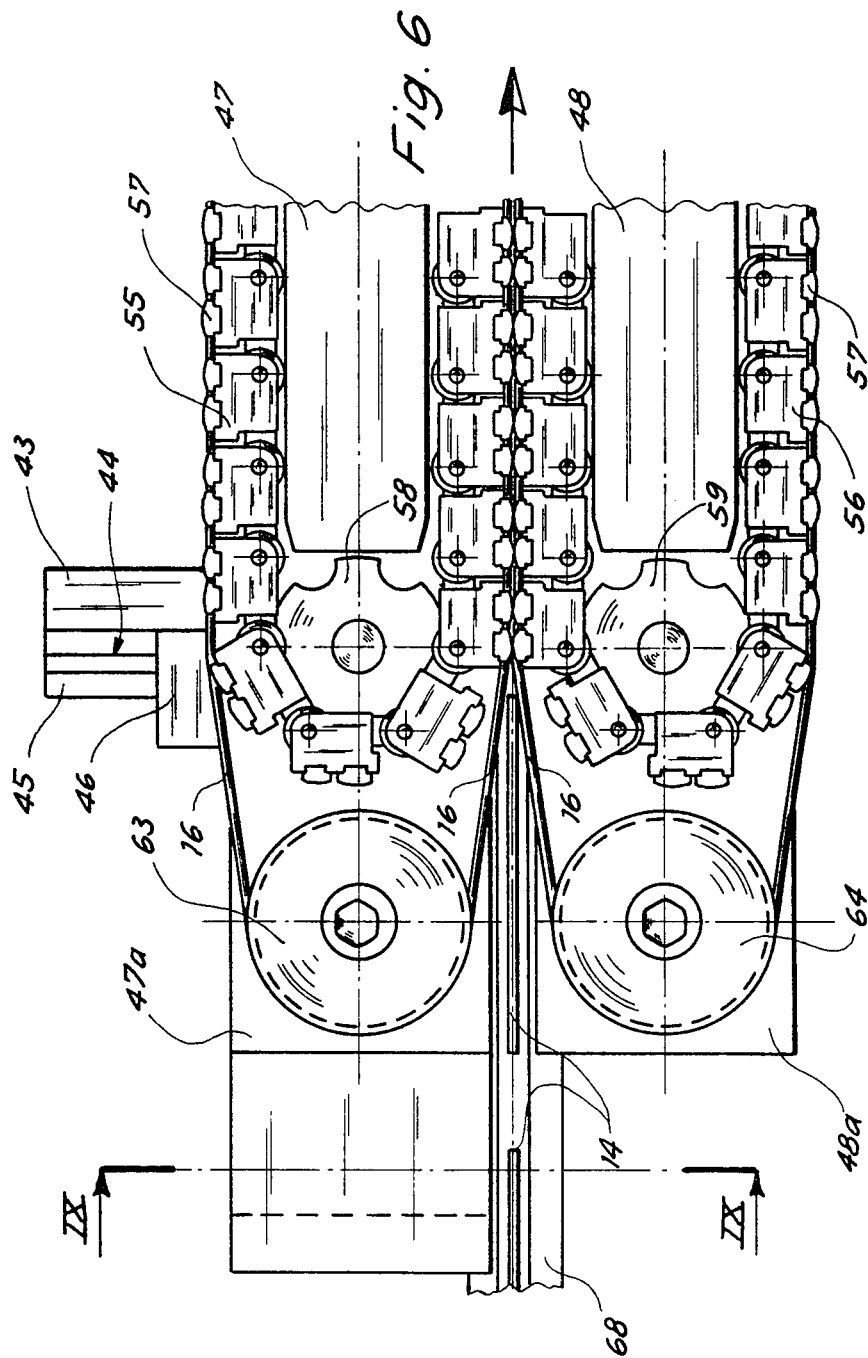

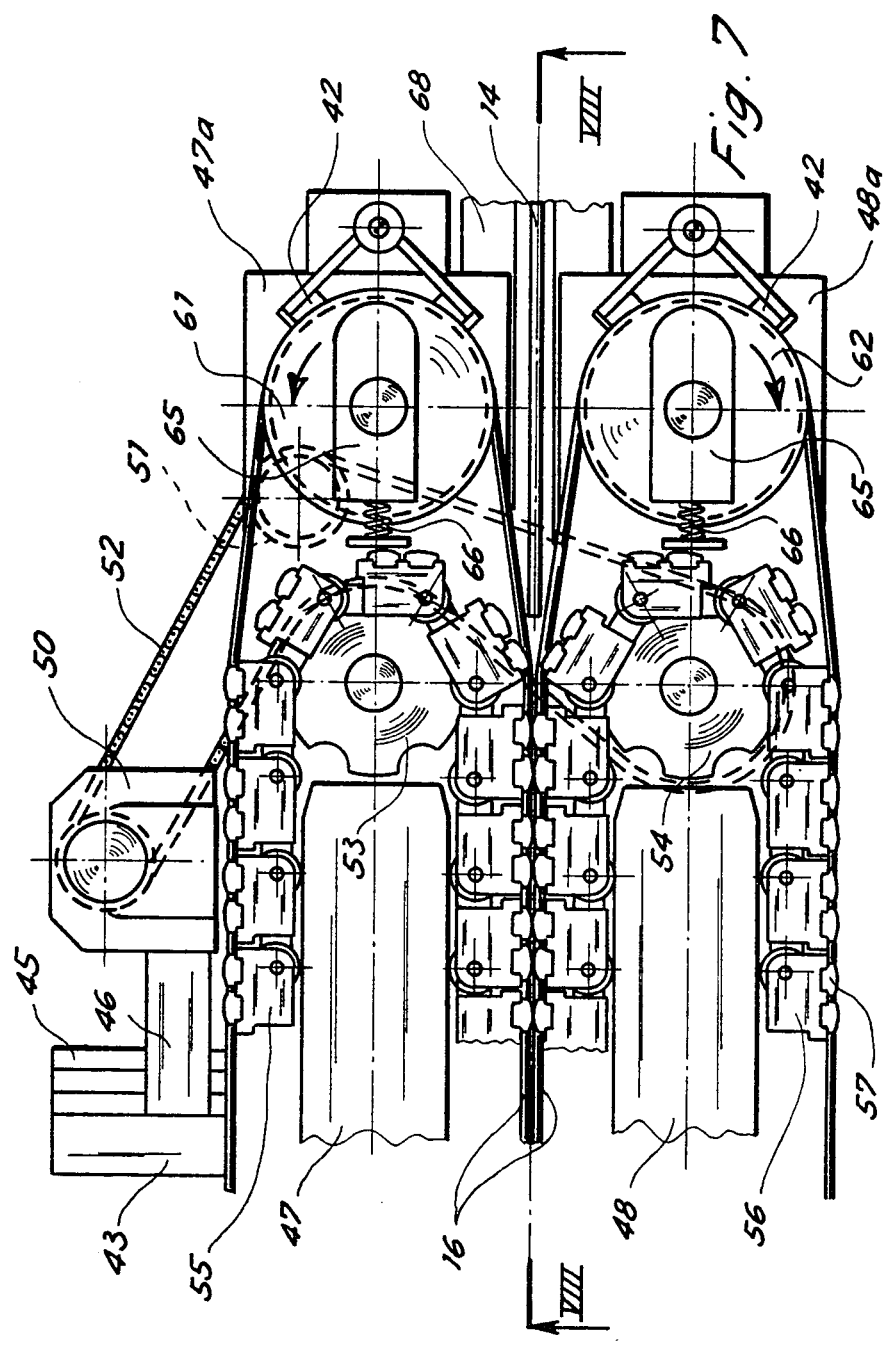

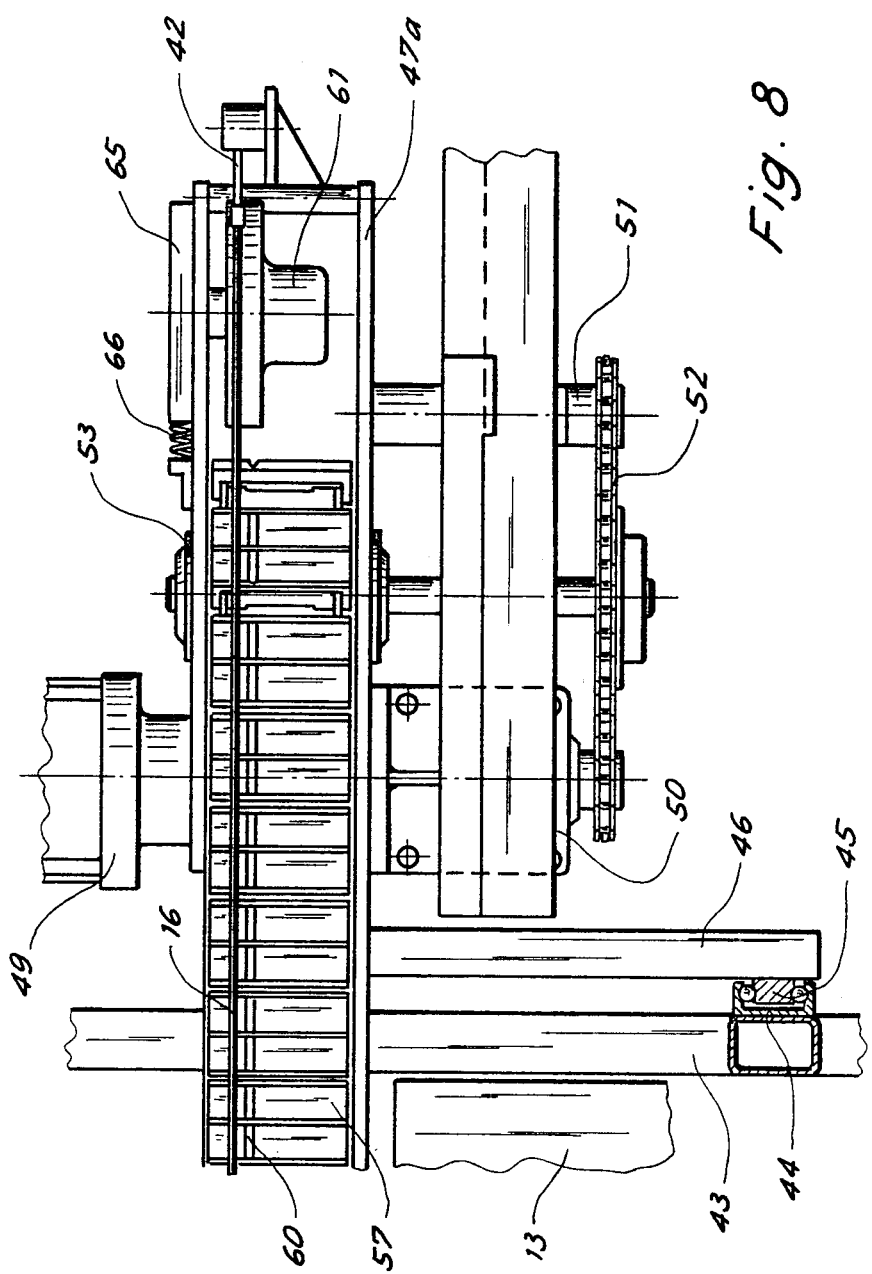

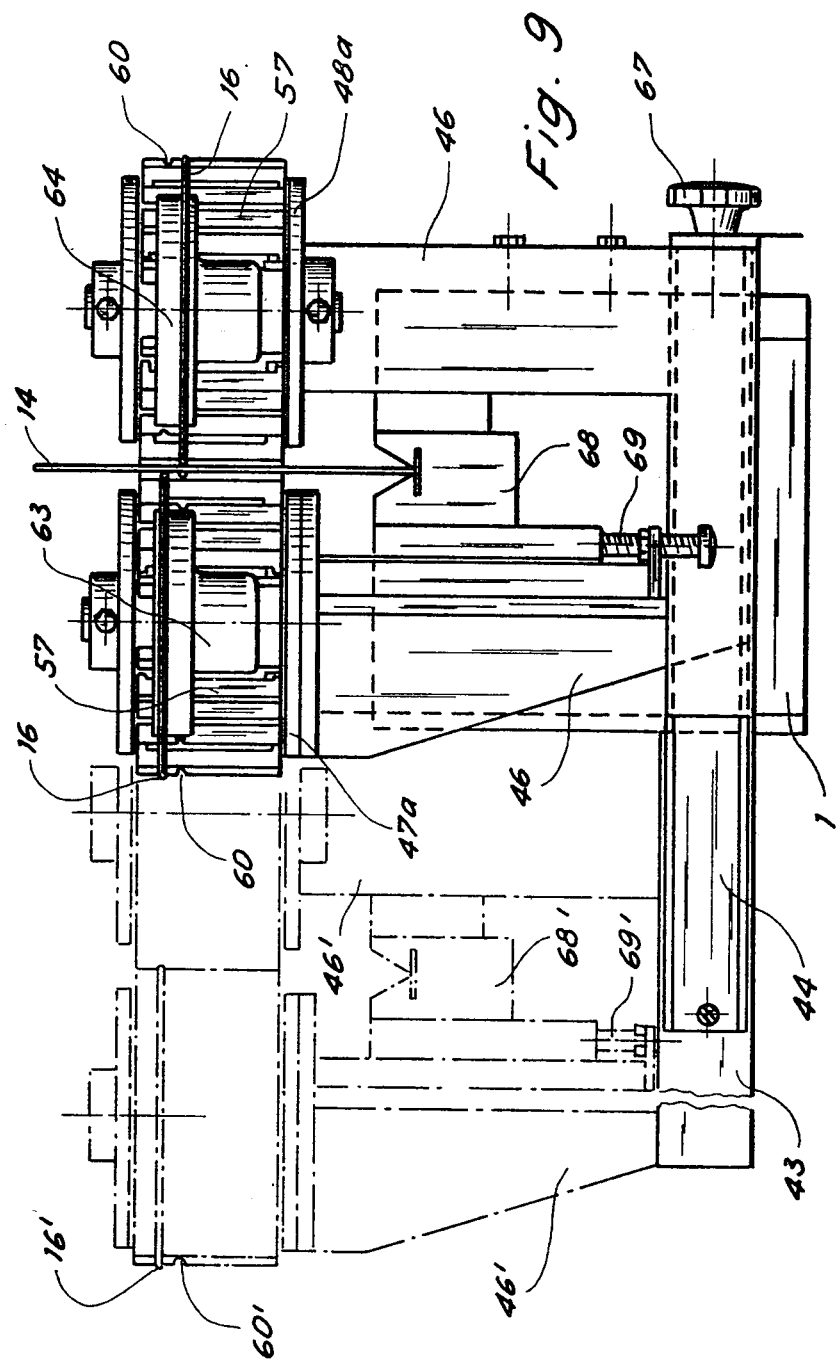

MACHINE FOR THE CONTINUOUS GOLD-PLATING OF CONTACT TABS

FIELD OF THE INVENTION

My present invention relates to the gold plating of the contact tabs of printed circuit boards and, more particularly, to an apparatus for this process.

BACKGROUND OF THE INVENTION

Printed circuit boards for electronic equipment are provided with contact tabs disposed along one or more sides of their perimeter; such contact tabs require a surface gold-plating for satisfactory passage of current and to prevent oxidation of the contact tabs. To this end, an apparatus is provided for the sequential action of a plurality of chemical and electrochemical baths; these strip the tin-lead protective coating from the area of the circuit to be gold-plated and applying a nickel coating which imparts sufficient hardness to the contact tabs, and then apply the gold-plating in constant thickness to the contact tabs.

For this purpose use can be made of separate baths and tanks, which however makes the equipment bulky and requires much manpower, or continuously operating machines. Such machines have a number of problems, including excessive overall length to provide a sufficient output, the difficulty of effecting a dependable cathodic contact and the seal of the modules in the areas traversed by the circuit boards. The cathodic contact is usually effected by contact clips which run along the whole length of the machine; in such case, however, the contact clips must be restored to their initial position which is difficult. Alternatively, contact is effected by brushes sliding against the printed circuit boards which can damage said printed circuit boards with their continuous rubbing. The seal of the modules is usually made by means of rubberized gaskets; this type of seal, however, does not wholly prevent losses and leaks of liquid.

OBJECT OF THE INVENTION

It is the principal object of the invention to avoid these drawbacks.

SUMMARY OF THE INVENTION

According to the present invention, these and other problems are resolved by a machine for the continuous gold-plating of contact tabs for printed circuit boards and the like which comprises a plurality of chemically and electrochemically operating cells in sequential alignment; the printed circuit to be gold-plated is conveyed through the cells by a belt conveyor member which effects the electrical connection of said connectors to the negative pole of the circuit, each of said cells being provided with one or more feed chambers for feeding the electrochemical bath, at least one collection tank and at least one liquid-loss recovery chamber, provision being made for a cascade flow area through which the portion of the printed circuit board bearing the contact tabs passes.

In said modules, the feed chambers are provided with opposed bulkheads provided with a plurality of arrays of holes adapted to allow the passage of a cascade flow of the chemical or electrochemical bath of the module, the two cascade flows which leave the said bulkheads lapping the two sides of printed circuit boards in the area of said contact tabs.

To effect the electrochemical deposition of the gold and nickel coatings, one or more anodes can be placed in some of cells upstream of said cascade flow area. In the entry and exit area of the printed circuit boards into and out of a cell, there is a liquid-loss recovery chamber which receives any liquid losses, dropwise or otherwise, coming from said feed chamber during the passage of said printed circuit boards.

The aforesaid belt conveyor member consists of two endless belts made of deformable material which are tensioned between two pairs of rotating rollers, two parallel sides of said belts being placed at a distance adapted to receive, with deformation of the said belts, said printed circuit boards supporting their weight by friction. On each of the belts there are one or more bare wires which are in endless configuration and tensioned between two pairs of rollers, these wires being kept in contact with the conductor tracks of the printed circuit boards by the pressure brought to bear between the belts and the printed circuit boards, the conductor tracks being connected to the negative pole of the electric circuit of the cell by pressure-brushes or the like. The belts braced against roller chains in endless configuration rotating within the endless-ring of each of the belts, so as to be able to bring a sufficient pressure to bear on the conveyed circuit boards.

According to a particular form of embodiment, the machine comprises a pair of chain conveyors in endless configuration, carrying pads constructed of flexible and insulating material which are adapted to run a common linear course and which lock the p.c. boards between them and have bare wires in contact with moved the printed circuit boards so as to pass electric current. The said chain conveyors run a rectilinear course above said sequence of treatment cells, the parts of the printed circuits to be coated being immersed in the cells. The chain conveyors and the bare wires, with further drive means, control and transmission means, positioning and guide means are supported by a single frame, which is mobile on transversal horizontal guides which make it possible for the whole to be shifted from the operative position above the cells to a position at a distance from the previous position which is adapted to permit free access to the said chemical and galvanic treatment cells.

BRIEF DESCRIPTION OF THE DRAWING

Further details of the machine according to the present invention will be apparent from the following description and can be seen from the attached drawing, in which:

FIG. 1 is a schematic overall illustration of the machine according to the invention;

FIG. 2 is a cross-sectional view of a module;

FIG. 3 is a longitudinal section of a module, taken through the plane III—III of FIG. 2;

FIG. 4 is a side view of one end of the member for conveying the circuits and effecting the cathodic connection, partially cross-sectioned;

FIG. 5 is a top view of the end of the conveyor member of FIG. 4;

FIG. 6 is a partial top view of the board-loading side of the conveyor device in a particular embodiment;

FIG. 7 is a partial top view of the board-unloading side of the conveyor device of FIG. 6;

FIG. 8 is a section taken through the plane VIII—VIII of FIG. 7; and

FIG. 9 is a section taken through the plane IX—IX of FIG. 6, seen in the direction of the feed of the printed circuit into the machine.

SPECIFIC DESCRIPTION

According to the schematic view of FIG. 1, there is a first cell 1 in which the tin-lead coating protecting the copper tracks of the printed circuit boards in the area of the contact tabs to be gold-plated is stripped. This stripping is for example effected by an electrolytic bath of fluoboric acid and hydrogen peroxide, at room temperature.

Next following the stripping cell 1 is a first rinsing tank 2, which is followed by a section 3 for the mechanical brushing of the contact tabs, an activation tank 4, for example using dilute sulphuric acid, and a second rinsing tank 5 prior to the nickel-plating cell 6.

Said nickel-plating cell is followed by a further rinsing tank 7, an activation tank 8, for example using citric acid, a rinsing tank 9 and by the gold-plating cell 10. At the outlet of said cell 10 there is a gold rinsing and recovery tank 11, a rinsing tank 12 which sends the rinse waters to waste, and a final drying oven 13.

Conveyance of the printed circuit boards 14 is ensured by the double rubberized conveyor 15, more clearly seen in FIGS. 4 and 5, which also uses cathodic contact bare wires 16 connected to the negative pole of the circuit through the rollers 17, which can be seen more clearly from FIGS. 4 and 5.

FIG. 2 gives a cross-sectional view of a cell of the machine, above which there can be seen in section the double rubberized conveyor 15 provided with the contact bare wires 16 and the support roller chains 18.

The cell consists of an outer casing 19, within which are delimited two lateral feed chambers 20 connected by the apertures 21 to the inlet chamber 22.

The feed chambers 20 in their upper portion each have a pair of holed bulkheads 23, from the holes 24 of which, more clearly seen from FIG. 3, the flow of liquid debouches, bathes the printed circuit board 14 and falls, as shown by the arrow, into the collection tank 25. Before debouching from the holes 24 in the bulkheads 23 the electrolytic bath flows over the anodes 26 connected to the voltage generator. Said anodes are not present in the stripping cell.

The liquid-loss recovery chamber 27 is located in the lower portion of the outer casing 19. In said chamber, which can be more clearly seen from FIG. 3, the electrolytic solution which does not fall into the collection tank 25 is recovered along with any drops from the circuit boards 14 when leaving the cells.

There is consequently no need to embody seal gasketing on the sections where the circuit boards enter and leave the cell, since the direction of the liquid flow debouching from the holes 24 of the bulk heads 23 is distinctly delimited and since, as FIG. 3 shows, provision is made for the chamber 27 for the recovery of further liquid losses and leaks.

To allow a sufficient throughput of electrolytic solution from the holes 24, the feed chamber 20 are kept under pressure by the feed pump; such pressure can be gauged from the liquid head present in the lateral conduits 28 which are constructed of plastic material or provided with a float.

The length "L" of the cell shown in FIG. 3 will depend on the machine speed required, which in turn determines the dwell-time of the printed circuit boards in the electrolytic baths of each cells and thus the required length of each.

The chambers 25 and 27 discharge the electrolytic solution into the reserve tank 29, from which the feed pump 30 takes off the said solution and sends it with the requisite head and flow-rate to the inlet chambers 22.

The reserve tank 29 is also provided with a recycling pump 31 and a filter 32, so as to ensure the homogeneity of the solution and to retain any impurities.

As is shown in FIG. 3, the printed circuit boards 14 is provided, in an appropriate part thereof, with a protective coating 33 which delimits the portion of the printed circuit board that is accessible to the chemical and electrochemical baths of the machine and which comprises the contact tabs to be gold-plated.

To ensure that the baths of each cell are kept at the temperature most favorable for the reaction rate, provision is made for a heating element, for example of an electrical type (not illustrated), accompanied by an appropriate temperature control means.

As is shown in FIGS. 1 and 2 and, in greater detail, in FIGS. 3 and 4, the conveyance of the printed circuit boards 14 is effected by a pair of rubber conveyors 15 between which the circuit is restrained. Said conveyors each consist of an endless-configuration belt 34 constructed of soft, elastic material and tensioned between two end wheels, one of which is shown in FIGS. 3 and 5 by the reference numeral 35. The endless configuration belt 34 rests laterally against the roller chain 18, which ensures a sufficient counteraction to restrain the printed circuit 14 between the two adjacent belts 34 and support it by friction during the conveyance. The roller chain 18 rotates about two end wheels, one of which is shown in FIGS. 4 and 5 by the reference numeral 36, and rests against the support bar 37, thus being driven at a speed equal to half the speed of the belt 34. In order to keep the belts 34 in a correctly guided position there are embodied in the roller 35 and in the rollers of the chain 18 one or more shaped grooves 38, to which there correspond in the relative belt 34 one or more longitudinal reliefs 39.

The surface of the belt 34 also has a plurality of grooves within which one or more bare wires (not mentioned) 16 are fitted; these bare wires are pressed against the printed circuit 14 by the belt 34 and come into contact with the conductive-material tracks thereof, so assuring the electrical connection of the cathode to the negative pole of the circuit. The bare wires 16 are of endless configuration and are tensioned between two rollers 40 provided with races 41. At least at one ends of the conveyor, said rollers 40 are constructed of conductive material, and the brushes 42 connected to the electric plating circuit press on the rollers. At least at one end of the conveyor, a roller 35, a roller 40 and a toothed wheel (not illustrated) which is coupled to the roller chain 18, all these relative to each of the belts 34, are motor driven, with transmission ratios adapted to furnish a graze-free movement between the belt 34, the roller chain 18 and the bare wire 16, at the required running speed.

According to an advantageous embodiment, the gold-plating machine can consist, as shown in FIGS. 6, 7, 8 and 9, of a fixed frame 43 supporting the cells 44 and the fixed guide of a linear ball-bearing 44 the mobile part 45 of which is solid with the mobile frame 46, embodied in two parts, as shown in FIG. 9. On the outlet side, shown in FIG. 8, the structure is the same as heretofore described and the said two parts of the frame 46 support to girders 47 and 48 disposed in the longitudinal direction of the machine and extending beyond the support frame 43 by means of projections 47a and 48a having flared-flange configuration and adapted to support the control unit of the printed circuit board conveyor, as can be seen from FIG. 7. The said conveyor unit consists of a motor 49 which, by means of the reduction-gear 50 (FIGS. 7 and 8), the transmission gearwheel 51 and the chain 52, actuates the two gearwheels 53 and 54, the former of which rotatable anticlockwise and the latter clockwise, thus transmitting the motion to the two roller chain conveyors 55 and 56 resting on the girders 47 and 48 and featuring pads 57 made of suitable material which is both insulating and deformable so that they can support and convey by friction the printed circuits boards 14, as is shown in FIG. 9.

The chains of the chain conveyors 55 and 56 are guided by further gearwheels 58 and 59 positioned on the machine inlet side, in alignment with the said two drive gearwheels 53 and 54. One or more grooves 60 are formed in the links 57 and are adapted to contain, only in part, the bare wires 16 of copper or other suitable conductive material, which uncoil in endless configuration around the idle pulleys 61, 62, 63 and 64; the copper bare wires are kept under appropriate tension by two thrust-supports 65 under the action of the pressure springs 66. The copper bare wires 16 are maintained at cathodic potential by the brushes 42.

During their motion, the insulant-material pads 57 carried by the chains 55, 56 entrain the conductive bare wires 16 and the printed circuit boards 14 at a zero relative velocity, thus obviating any grazing between conductor and printed circuit boards, which could damage the electrical circuits printed on said boards, in a manner similar to that of the belts 34. On the printed circuit board inlet side provision is also made for a unit for regulating the depth of immersion of the printed circuit boards into the cells; this is composed of a block 65 having a V-section groove so as to facilitate the entry of the printed circuit boards even in the case of slight lateral inclination. A vertical screw 66 allows the height of the printed circuit boards with respect to the treatment cells to be regulated.

The two girders 47 and 48 are supported by flanges 47a and 48b restrained to the moving part 45 of the two linear bearings 44, so that there are formed two wholly independent frame sections: a first frame section supporting the sequentially disposed and aligned treatment cells and a second mobile section carrying the entire printed circuit board conveyance and electrical feed system as hitherto described. The said mobile section can be locked in the operative position, for example by a threaded handle 67; if the handle 67 is unlocked it consequently becomes possible to translate manually in a transversal direction the entire conveyance section so as to uncover the cells, as shown by the dotted and dashed line in FIG. 9, to allow ready access thereto for cleaning and servicing operations. The translation can also be effected by pneumatic, electric actuators or the like, in which case provision is made for control and signalling means which allow the printed circuit boards to advance only when the machine is in closed or operative position.

In order to permit the machine to be adapted to the baths employed and the required deposition thicknesses, it is advantageously possible to provide a feed speed variator device for the entire conveyance assembly.

The above described conveyor assures a viable electric contact between the cathode of the cell and the negative pole of the electric circuit without the use of brush contacts or contact clips employing a festoon connection, a continuous contact being assured by the printed circuit boards conveyance member itself.

The use of cells having the structure described enables a higher current density to be used on account of the presence of the cascade flow lapping the surface of the printed circuit connectors; the higher current density allows a higher output and elevated machine compactness.

By way of indication, use can be made of a feed rate of between 0.5 and 2 meters per minute, in a machine of total length smaller than 4.50 m; however, depending on the baths employed, their temperatures and the like, these values can be varied.

The machine regulation and control equipment can be of conventional type, and is therefore not given a detailed description.

A large number of variants of the present invention can be used, without falling outside its scope.

I claim:

1. A machine for the continuous gold-plating of contact tabs connected to conductor tracks of printed circuit boards and the like, comprising a plurality of chemically and electrochemically acting cells conveniently of modular structure aligned in sequential order, through which the printed circuit to be gold-plated is conveyed by conveyor members in endless configuration which effects the electrical connection of said contact tabs to the negative pole of the circuit, each of said cells being provided with one or more feed chambers for feeding the electrochemical bath, at least one collection tank and at least one liquid-loss recovery chambers, there being a cascade flow area through which the portion of the printed circuit boards bearing said contact tabs passes, said conveyor members consisting of two endless belts constructed of deformable material which are tensioned between two pairs of rotating rollers, two parallel sides of said belts being placed at a distance adapted to receive, with deformation of said belts, said printed circuit boards, supporting its weight by friction, there being present on each of the belts one or more bare wires which are in endless configuration and tensioned between two pairs of rollers, these being kept in contact with the conductor tracks of said printed circuit boards by the pressure brought to bear between the belts and the printed circuit boards, the conductor tracks being connected to the negative pole of the electric circuit of the cell by pressure-brushes or the like.

2. A machine according to claim 1, wherein in said cells the said feed chambers are provided with opposed bulkheads which feature a plurality of arrays of holes adapted to allow the passage of a cascade flow of the chemical or electrochemical bath of the cell, the two cascade flows debouching from said bulkheads lapping the two sides of said printed circuit boards in the area of said contact tabs.

3. A machine according claim 1 wherein said cells contain one or more anodes placed in said feed chambers upstream of said cascade flow area.

4. A machine according to claim 1, wherein in the areas where the printed circuits enter and leave a cell provision is made for a liquid-loss recovery tank into which fall liquid-leaks, dropwise or otherwise, coming from said feed cell during the passage of said printed circuits boards.

5. A machine according to claim 1 characterized in that said belts rest against roller chains in endless configuration rotating within the endless-ring of each of the belts.

6. A machine for the continuous gold-plating of contact tabs for printed circuit boards and the like, comprising a plurality of chemically and electrochemically acting cells conveniently of modular structure aligned in sequential order, through which the printed circuit to be gold-plated is conveyed by conveyor members in endless configuration which effects the electrical connection of said contact tabs to the negative pole of the circuit, each of said cells being provided with one or more feed chambers for feeding the electrochemical bath, at least one collection tank and at least one liquid-loss recovery chambers, there being a cascade flow area through which the portion of the printed circuit boards bearing said contact tabs passes, said conveyor member consisting of a pair of chain conveyors in endless configuration carrying pads constructed of flexible and insulant material which are adapted to run a common linear course and which lock the printed circuit boards between them and feature bare wire in contact and in movement with said printed circuit boards so as to pass electric current from the cathode to the anode, the chain conveyors and the bare wire, with further drive means, control and return means, positioning and guide means, being supported by a single frame, which is mobile on transversal horizontal guides which enable the whole to be shifted from the operative position above the cell to a position at a distance from the previous position and adapted to permit free access to said chemical and galvanic treatment cells.

7. A machine according to claim 6, characterized in that said printed circuit boards positioning means are height-wise adjustable in relation to the extension of the area to be galvanically coated.

8. A machine according to claim 5, characterized in that the said bare wires are tensioned between two pairs of rollers aligned with the axes of the pair of wheels actuating said chain conveyors and are kept under tension by means thrusting against one of the rollers of each pair and are guided by grooves formed on said locking pads of the chain conveyors, projecting from said grooves so as to effect an electrical contact with the printed circuits boards on each side of the said printed circuit boards without relative movement between said bare wire and said printed circuits boards.

9. A machine according to claim 6, characterized in that the translation movement of said mobile frame from the operative position to the position allowing access to the treatment modules can be effected manually or by mechanical pneumatic or electrical means.

10. An apparatus for the electroplating of tabs of a printed circuit board electrically connected to tracks or at least one side thereof, said apparatus comprising a transport path for said board having a plurality of cells for contacting said tabs with respective liquids, at least one of said cells comprising a pair of apertured walls extending parallel to said path in substantially vertical planes flanking said path, means for forcing an electrolyte through said walls against a printed circuit board displaced between said walls in an upright position, and means below said walls for collecting said electrolyte, said electrolyte contacting at least one anode on its way to contact with said boards; and means for displacing said board along said path, said means including a pair of endless members receiving said board between them in an upright position for frictionally supporting said board while entraining said board through said cells, and at least one bare wire running along one of said members and pressed by said wire of said members against said board for electrical contact with the tracks thereof for connecting said board electrically to an electroplating current supply.

11. The apparatus defined in claim 10 wherein said members are endless belts braced by roller conveyors against said board.

12. The apparatus defined in claim 10 wherein said members are individual links of a roller conveyor having pads engageable with said board.

* * * * *